US006614665B2

United States Patent
Witty et al.

(10) Patent No.: US 6,614,665 B2
(45) Date of Patent: Sep. 2, 2003

(54) CABLE MANAGEMENT BRACKET FOR A TELECOMMUNICATIONS RACK

(75) Inventors: Amy J. Witty, Prior Lake, MN (US); Todd Michael Bade, Inver Grove Heights, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 09/835,808

(22) Filed: Apr. 16, 2001

(65) Prior Publication Data

US 2002/0149923 A1 Oct. 17, 2002

(51) Int. Cl.[7] .................................................. H02B 1/20
(52) U.S. Cl. ...................... 361/826; 361/800; 361/797; 361/683; 174/52.4; 174/28; 439/92
(58) Field of Search ................................ 361/826, 797, 361/804, 800, 827, 825, 829, 683; 439/92, 95; 174/52.4, 24, 28

(56) References Cited

U.S. PATENT DOCUMENTS 5,448,015 A * 9/1995 Jamet et al. ................ 174/101
5,640,482 A    6/1997 Barry et al.
5,993,251 A * 11/1999 Brown et al. ............ 439/540.1
6,044,194 A *  3/2000 Meyerhoefer ................ 385/134
6,307,997 B1 * 10/2001 Walters et al. ............... 385/134
6,467,633 B1 * 10/2002 Mendoza ..................... 211/26

FOREIGN PATENT DOCUMENTS

| EP | 0 795 935 A2 | 9/1997 |
| GB | 2 350 944 A | 12/2000 |
| WO | WO 01/74091 A2 | 10/2001 |

* cited by examiner

Primary Examiner—David Martin
Assistant Examiner—Hung Bui
(74) Attorney, Agent, or Firm—Merchant & Gould, P.C.

(57) ABSTRACT

A cable management bracket for a telecommunications rack. The bracket includes an elongated member having a length sized to extend across a width of the rack. A plurality of fingers project outwardly from the elongated member. The fingers are spaced apart along the length of the elongated member. Gaps sized to receive telecommunications cables are positioned between the fingers. Bend radius limiters are preferably connected to the fingers to prevent cables passing through the gaps from being bent beyond predetermined bend radius requirements.

12 Claims, 13 Drawing Sheets

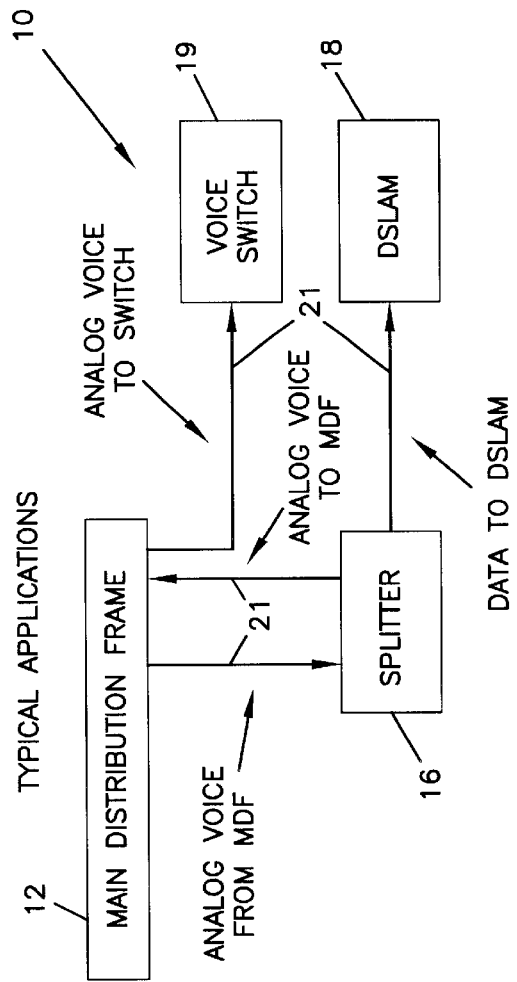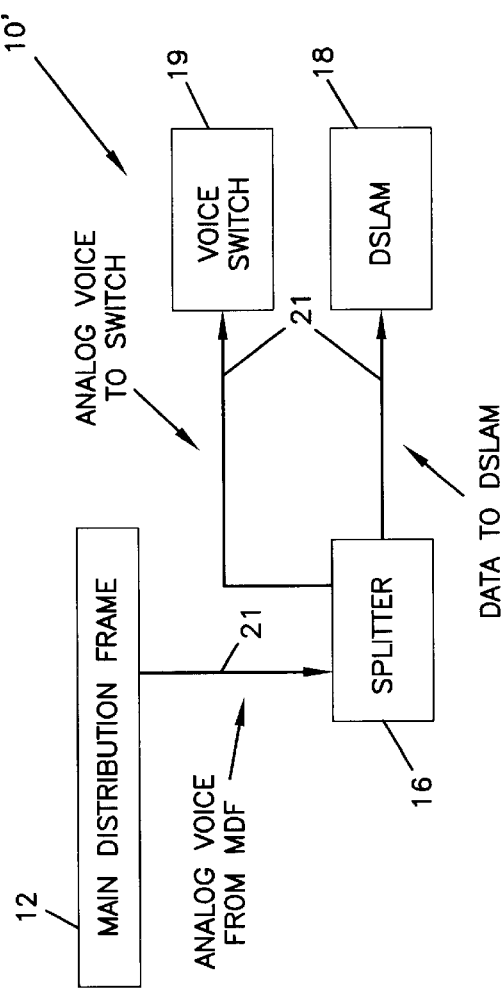

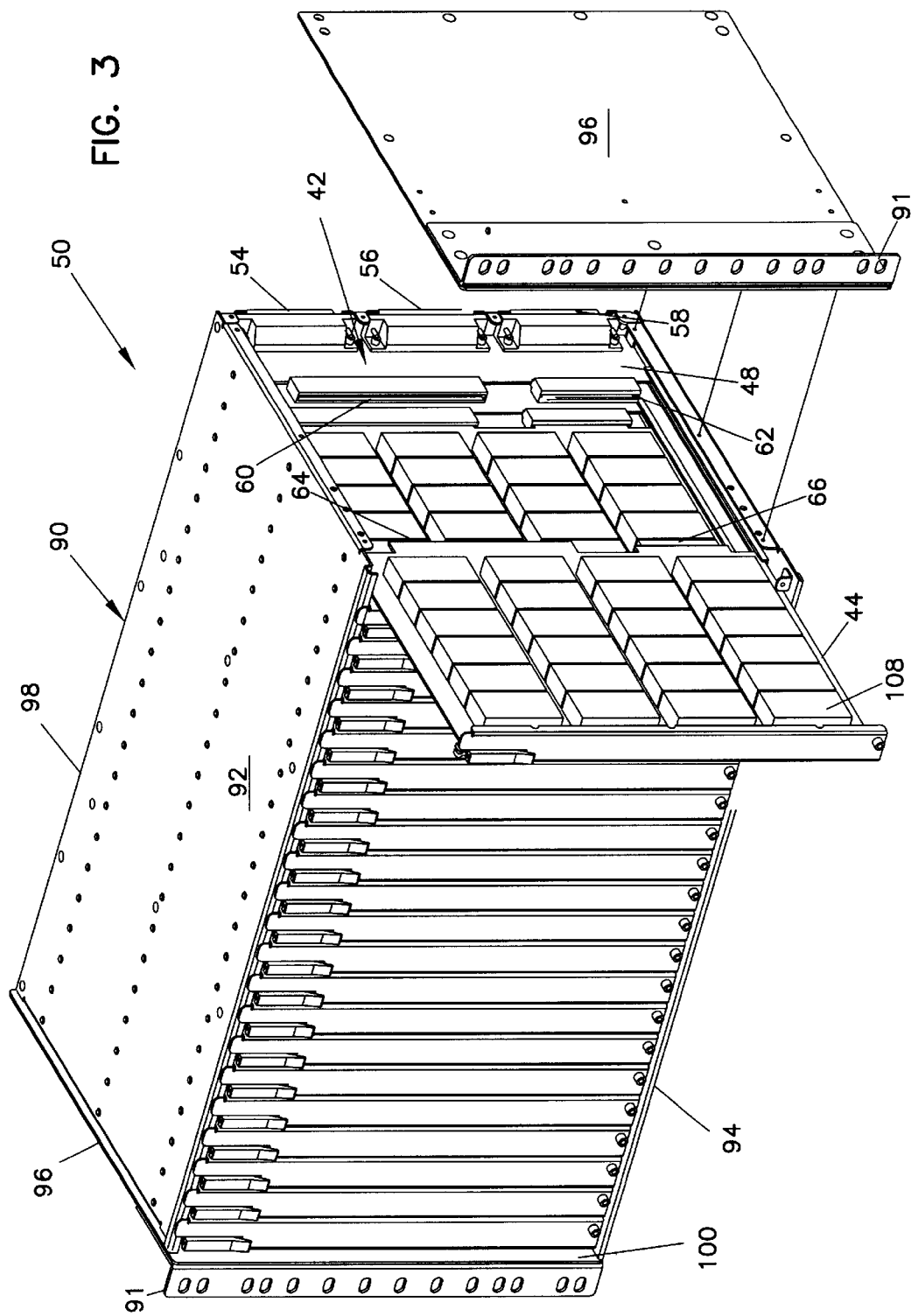

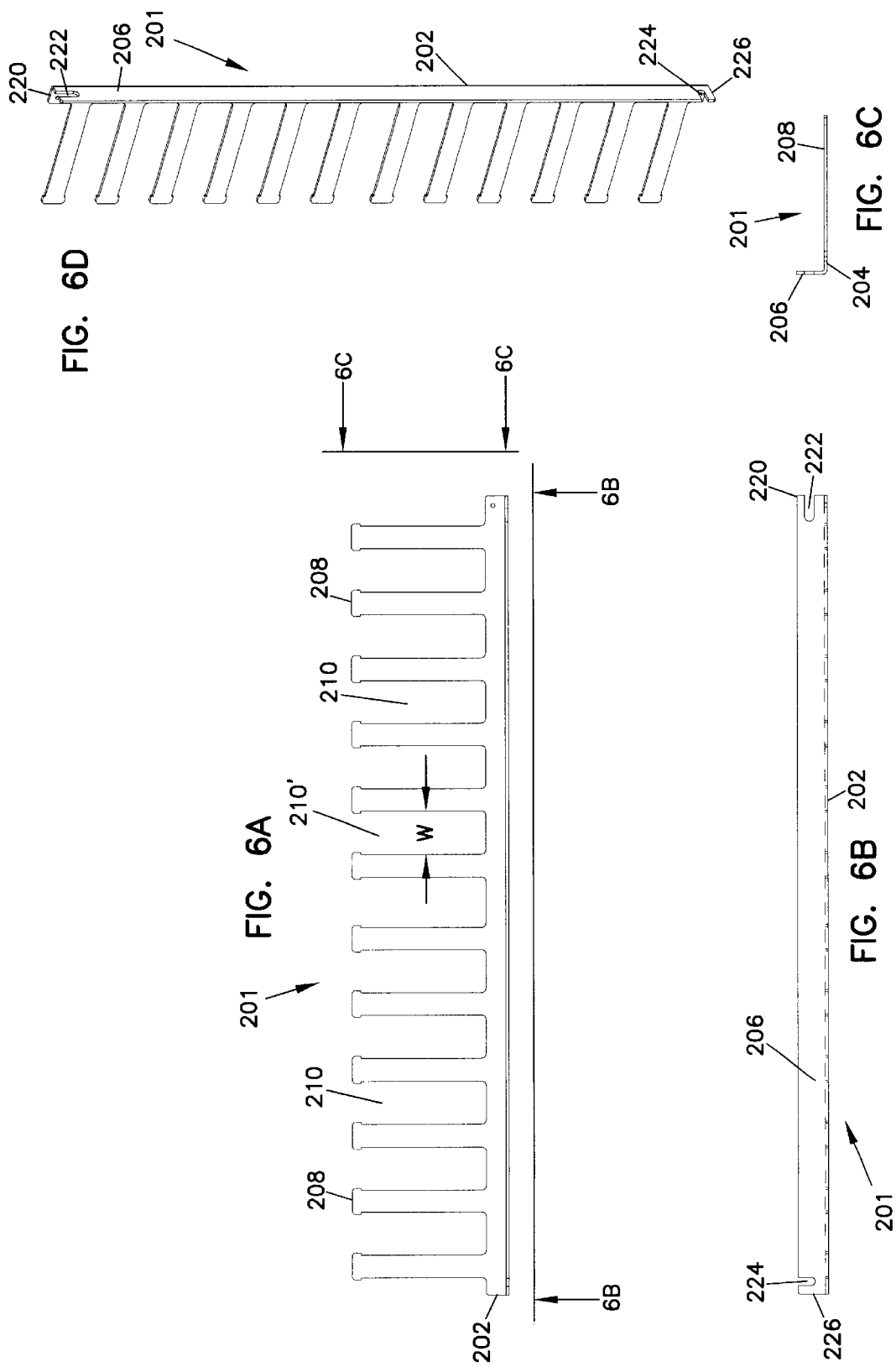

CABLE MANAGEMENT BRACKET FOR A TELECOMMUNICATIONS RACK

FIELD OF THE INVENTION

The present invention relates generally to devices for enhancing cable management in a telecommunications system. More particularly, the present invention relates to cable management brackets for use in telecommunications systems.

BACKGROUND OF THE INVENTION

Telecommunications systems commonly include cables (e.g., fiber optic cables or copper twisted pair cables) for interconnecting pieces of telecommunications equipment. For example, in a typical telephone carrier system servicing residential and/or businesses, cables are used to couple components such as an MDF (main distribution frame), a POTS (plain old telephone service) splitter for separating voice and data signals and a DSLAM (digital subscriber line access multiplexer). A telephone carrier's central office commonly includes multiple rows of telecommunications racks. Each rack typically holds a variety of different pieces of telecommunications equipment. Often thousands of cables are used to interconnect the various pieces of telecommunications equipment mounted on the racks.

Because of the large number of cables present at a location such as a telephone carrier's central office, cable management is crucial. Cable management involves efficiently routing cables to minimize the space occupied by such cables. Cable management also involves routing cables in an orderly manner so as to reduce the likelihood of "spaghetti" (i.e., tangling of cables). Ease of cabling is also a factor related to effective cable management.

In routing cables, it is also desirable to prevent cables from being excessively bent. This is particularly true for fiber optic cables as well as copper cables adapted for transmitting data (i.e., Category 5 cables). If such cables are bent beyond certain predefined radius limits (e.g., four times the radius of the cable for Category 5 cable), signal degradation can possibly occur.

SUMMARY OF THE INVENTION

One aspect of the present invention relates to a cable management structure for a telecommunications rack. The structure includes an elongated member having a length sized to extend across a width of the rack. A plurality of fingers project outwardly from the elongated member. The fingers are spaced apart along the length of the elongated member. Gaps sized to receive telecommunications cables are defined between the fingers. Bend radius limiters are preferably connected to the fingers to prevent cables passing through the gaps from being excessively bent.

Another aspect of the present invention relates to a telecommunications system including a rack defining a bay in which are mounted one or more pieces of telecommunications equipment. The system also includes a cable management structure connected to the rack. The cable management bracket extends across a width of the bay of the rack and is aligned in a generally horizontal orientation. The cable management structure includes a plurality of fingers that project outwardly from the rack. The fingers define a plurality of gaps spaced across the width of the bay. The gaps are sized to receive cables connected to the piece of telecommunications equipment. The fingers include bend radius limiters for preventing the cables from being kinked.

In use of the system, cables are routed vertically upwardly or downwardly from the piece of telecommunications equipment to the cable management structure. At the cable management structure, the cables are routed through the gaps defined between the fingers of the cable management structure. At the cable management structure, the cables are bent around the radius limiters to smoothly transition the cables from a generally vertical orientation to a generally horizontal orientation. After being bent around the radius limiters, the cables are routed generally horizontally across the width of the bay to a side of the rack. At the side of the rack, the cables are routed either upwardly or downwardly along a channel defined at the side of the rack.

A variety of advantages of the invention will be set forth in part in the description that follows, and in part will be apparent from the description, or may be learned by practicing the invention. It is to be understood that both the foregoing general description and the following detailed description are exemplary and explanatory only and are not restrictive of the invention as claimed.

BRIEF DESCRIPTION OF THE DRAWINGS

FIG. 1 is a diagram of a telecommunications system including an MDF, a splitter device, a DSLAM, and a voice switch;

FIG. 2 is another telecommunications system including an MDF, a splitter device, a DSLAM, and a voice switch;

FIG. 3 is a partially exploded front, perspective view of a piece of telecommunications equipment (e.g., a splitter chassis) that can benefit from the cable management inventions of the present invention;

FIG. 6a is a top plan view of the telecommunications bracket of FIGS. 5 and 5b with the radius limiters removed;

FIG. 6b is an elevational view of the bracket of FIG. 6a taken from the perspective of view-line 6b—6b;

FIG. 6c is an end view of the bracket of FIG. 6a taken from the perspective of view-line 6c—6c;

FIG. 6d is a perspective view of the bracket of FIG. 6a;

Figure 4:
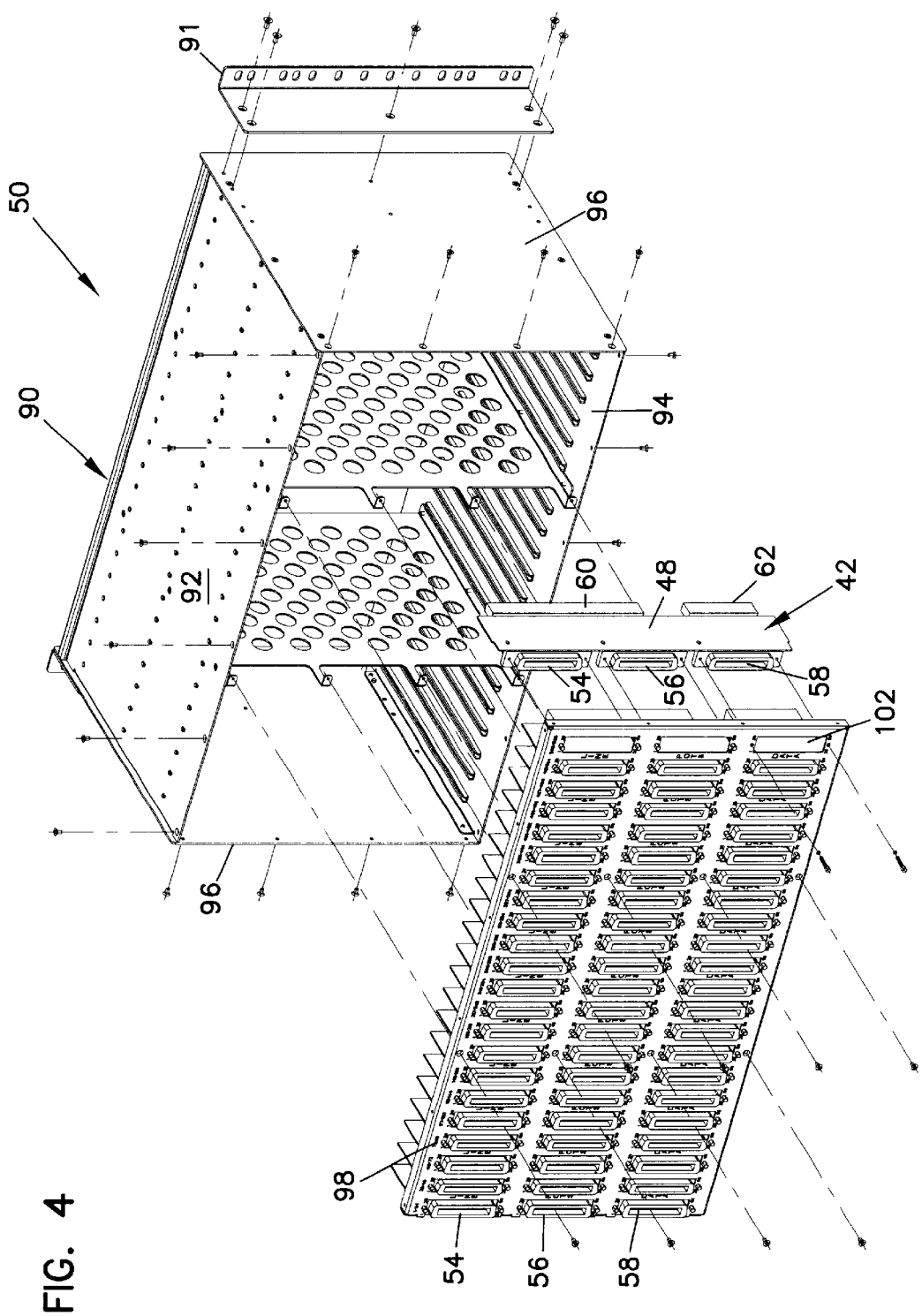
FIG. 4 is an exploded, rear perspective view of the piece of telecommunications equipment of FIG. 3.

While the invention is amenable to various modifications and alternative forms, specifics thereof have been shown by way of example in the drawings and will be described in detail below. It is to be understood, however, that the intention is not to limit the invention to the particular embodiments described. On the contrary, the invention is intended to cover all modifications, equivalents, and alternatives falling within the scope of the invention as defined by the appended claims.

DETAILED DESCRIPTION

In the following detailed description, references are made to the accompanying drawings that depict various embodiments in which the invention may be practiced. It is to be understood that other embodiments may be utilized, and structural and functional changes may be made without departing from the scope of the present invention.

Referring now to FIG. 1, a telecommunications system 10 is shown. The system 10 is representative of a telephone carrier's system for transmitting voice and data to residences and businesses. A main distribution frame (MDF) 12 is linked to a splitter device 16 (e.g., a card including POTS splitter circuits or ISDN splitter circuits). The MDF 12 is also linked to one or more DSLAM modules 18, and a voice switch 19 (e.g., a switch equipped with POTS interface line cards or ISDN interface line cards).

In use of the system 10, the splitter device 16 receives a mixed voice and data signal from the MDF 12. The splitter device 16 splits the mixed signal into split signals, and then filters the split signals. For example, one of the split signals can be filtered to provide a voice only signal (i.e., the high frequency data portion of the signal is filtered out), while the other split signal can be filtered to provide a data only signal (i.e., the low frequency voice portion of the signal is filtered out). The data only signals are passed from the splitter device 16 to the DSLAM 18. The voice only signals are passed from the splitter device 16 to the MDF 12 for transmission to the voice switch 19.

FIG. 2 shows a similar telecommunications system 10' having the same components as those described with respect to the telecommunications system 10 of FIG. 1. However, in the embodiment of FIG. 2, voice signals are transmitted directly from the splitter device 16 to the voice switch 19.

Referring still to FIGS. 1 and 2, the MDF 12, the POTS splitter device 16, the DSLAM 18 and the voice switch 19 are typically interconnected by cables 21. The cables 21 preferably each include multiple pairs of conductors for transmitting separate twisted pair signals. By way of example, the cables 21 can comprise 25 pair cables (i.e., cables each containing 25 pairs of wire conductors). Multi-pair connectors are used to provide interconnections between the cables 21 and the components of the telecommunications system 10. For example, multi-pair connectors are typically provided at the ends of the cables 21. The multi-pair connectors at the ends of the cables 21 are commonly coupled to corresponding multi-pair cable connectors mounted at the equipment to provide connections thereinbetween.

Exemplary multi-pair cable connectors suitable for use with telecommunications equipment as described above are sold by AMP of Harrisburg, Pa., a division of Tyco Electronics, as well as Telco. Connectors suitable for use with 25 pair cable typically include 25 pairs of contacts. Often, 24 pairs of the contacts are available for transmitting signals, while one pair is grounded. Straight connectors and right-angle connectors are also commonly used.

FIGS. 3 and 4 illustrate a POTS splitter assembly 50 which is an example of one type of telecommunications equipment that benefits from a cable management invention in accordance with the principles of the present invention. The splitter assembly 50 includes a generally rectangular chassis 90 for mounting a plurality of POTS splitter cards 44 or other cards. The chassis 90 is generally rectangular and includes a top side 92 positioned opposite from a bottom side 94. End plates 96 are provided for enclosing opposite ends of the chassis 90. A back plane plate 98 defines a back plane of the chassis 90, and a front side 100 of the chassis 100 is generally open. The chassis 90 also includes mounting brackets 91 connected to the end plates 96 for mounting the chassis 90 to a structure such as a telecommunications rack. More details concerning the chassis are provided in U.S. application Ser. No. 09/549,133, entitled SPLITTER ARCHITECTURE FOR A TELECOMMUNICATIONS SYSTEM, which was filed on Apr. 13, 2000, and is hereby incorporated by reference in its entirety.

The telecommunications assembly 50 preferably includes a plurality of interface cards 42 adapted to be coupled with corresponding ones of the splitter cards 44. The interface cards 42 are preferably mounted at the back plane of the chassis 90 and each preferably includes a circuit board 48 adapted to align at a generally perpendicular angle relative to the back plane. First, second and third multi-pair cable connectors 54, 56 and 58 are mounted at the back edge of each circuit board 48, and first and second card edge connectors 60 and 62 are mounted at the front edge of each circuit board 48. The first cable connector 54 is preferably a LINE connector for inputting twisted pair, mixed data/voice signals to the interface card 42. The second and third cable connectors 56 and 58 are used to respectively output twisted pair voice signals and twisted pair data signals from the interface card 42. Thus, the second cable connectors 56 can be referred to as POTS connectors and the third connectors 58 can be referred to as DATA connectors.

The connectors 54, 56 and 58 are preferably standard right-angle 25-pair (i.e., 50 pin) connectors. Suitable connectors for use with multi-pair cables are sold by a number of companies such as AMP of Harrisburg, Pa., a division of Tyco Electronics; Kycon, Inc. of San Jose Calif. or Telco.

The first and second card edge connectors 60 and 62 are used to provide a connection between the interface cards 42 and the splitter cards 44. For example, the splitter cards 44 include first and second card edge portions 64 and 66 that are respectively received within the first and second card edge connectors 60 and 62 when the splitter cards 44 are inserted within the chassis 90. Preferably, the splitter cards 44 are mounted within the chassis 90 by inserting the cards 44 through the open front end, and sliding the cards 44 rearwardly until an interface is provided between the splitter card 44 and its corresponding interface card 42.

The splitter cards 44 of the splitter assembly each include a plurality of POTS splitters 108 (e.g., 24 splitters) or other types of splitters mounted on a circuit board 110. The POTS splitters 108 can have a number of different configurations. For example, the splitters 108 can include conventional POTS splitter circuits. A conventional POTS splitter circuit functions to split a composite signal (i.e., a mixed voice/data signal) into two composite signals. One of the split composite signals is typically passed through one or more low pass filters capable of passing the relatively lower frequency voice content of the composite signal (e.g., less than about 4 kilohertz) and rejecting the composite signal content above the voice band (e.g., 30 kilohertz and above). The other split composite signal can be passed through a high pass filter that passes the composite signal content associated with the data band (e.g., about 30 kilohertz and above), and rejects the relatively lower frequency voice content of the composite signal. Alternatively, the other split signal can be unfiltered such that the signal remains a composite signal. For such an embodiment, it is assumed that the DSLAM or other digital multi-plexer that ultimately receives the composite signal will provide any required high-pass filter elements to remove the relatively low frequency voice signal content of the composite signal. It will further be appreciated that ISDN filter circuits could also be used.

Referring now to FIG. 4, the back plate 98 of the chassis 90 defines an array of openings 102. The array of openings 102 includes top, middle and bottom horizontal rows of openings. The array of openings 102 also includes 22 vertical columns of openings. The top row of openings receives the line connectors 54, the middle row of receive the POTS connectors 56, and the bottom row of openings receive the DATA connectors 58. Each vertical column includes a line connector 54, a POTS connector 56 and a DATA connector 58 and corresponds to one of the splitter cards 44.

Figure 7:
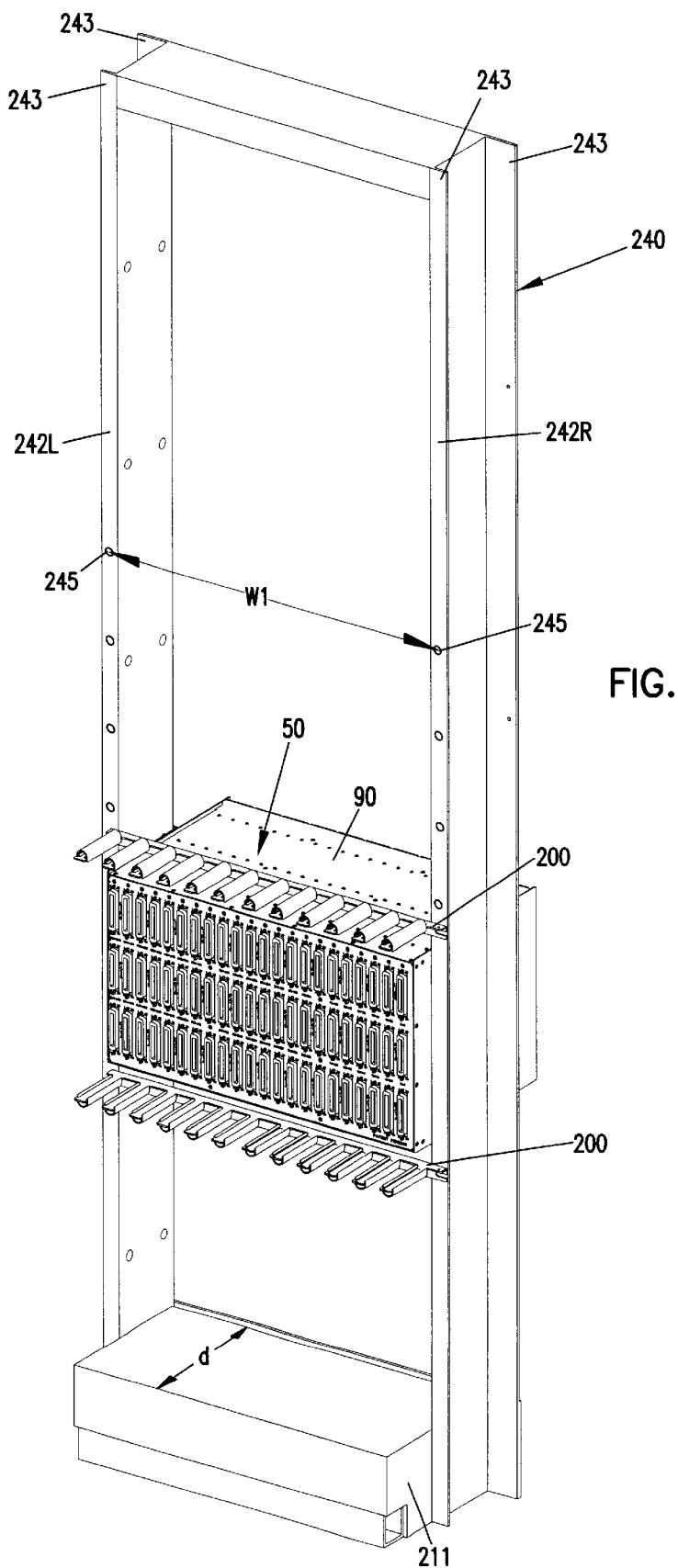
FIG. 7 is a rear perspective view of the piece of telecommunications equipment of FIGS. 3 and 4 mounted on a telecommunications rack with cable management brackets mounted above and below the piece of telecommunications equipment.

In use of the splitter assembly 50, composite signals are inputted to the splitter cards 44 through the line connectors 54. From the line connectors 54, the composite signals are carried to corresponding ones of the POTS splitters 108. At the POTS splitters 108, the composite signals are split into high frequency data signals and low frequency voice signals. The high frequency data signals are outputted from the chassis 90 through the data connectors 58 while the low frequency voice signals are outputted from the chassis 90 through the POTS connectors 56. The splitter assembly 50 is a rear access assembly (i.e., when mounted on a rack as shown in FIG. 7, the LINE, POTS and DATA connectors face rearwardly and are accessed from a back side of the rack).

FIGS. 5A, 5B and 6A–6D show a cable management structure 200 constructed in accordance with the principles of the present invention. Structure 200 is adapted for managing cables connected to a piece of telecommunications equipment such as the splitter assembly 50 of FIGS. 3 and 4. The cable management structure 200 includes a bracket 201 preferably constructed of a material such as bent sheet-metal. The bracket 201 includes an elongated member or bar 202. The bar includes first and second legs 204 and 206 preferably aligned generally at right angles relative to one another. A plurality of cable management fingers 208 project outwardly from the first leg 204 of the bar 202. As shown in FIG. 6C, the fingers 208 and the first leg 204 are generally coplanar.

Referring to FIG. 6A, the fingers 208 are generally parallel to one another and are spaced-apart along the length of the bar 202. Gaps 210 for receiving cables are defined between the fingers 208. The gaps 210 are preferably sized for receiving a plurality of telecommunications cables. As best show in FIG. 6A, the fingers 208 of the bracket 201 define a total of 11 gaps 210. For reasons described below, a middle gap 210' is preferably provided with a width W (e.g., about 1.4 inches) that is slightly larger than the widths of the other gaps 210. The remainder of the gaps 210 preferably have uniform widths (e.g., about 1.2 inches).

Referring to FIGS. 6B and 6D, the second leg 206 of the bar 202 preferably includes structure for allowing the bracket 201 to be connected to a telecommunications rack. For example, adjacent a first end 220 of the bar 202, the second leg 206 defines an open-ended mounting slot 222 sized to receive a fastener. The mounting slot 222 preferably has a length that extends in a direction parallel to the length of the bar 202. An opened ended slot 224 sized to receive a fastener is also defined adjacent a second end 226 of the bracket 201. The slot 224 has a length that extends in a direction transverse with respect to the length of the bar 222.

The depicted cable management structure 200 is adapted for use with the splitter assembly 50 of FIGS. 4 and 5. For this application, it is preferred for the cable management structure 200 to have 11 gaps having the widths described above. The lengths of the gaps are preferably about 3.9 inches and a total length of the cable management structure is about 23 inches. It will be appreciated that the number and size of the gaps can be varied without departing from the principles of the present invention.

Referring back to FIGS. 5A and 5B, the cable management structure 200 is shown including a plurality of bend radius limiters 228. The radius limiters 228 are connected to the fingers 208. The phrase "connected to" includes direct connections, integral connections, and indirect connections provided by one or more intermediate members. Lateral knobs or projections 229 located adjacent the ends of the fingers 208 prevent the radius limiters 228 from inadvertently sliding off the fingers 208. The knobs 229 project outwardly from the sides of the fingers 208 and are depicted as being co-planar with the fingers 208.

Figure 5A:
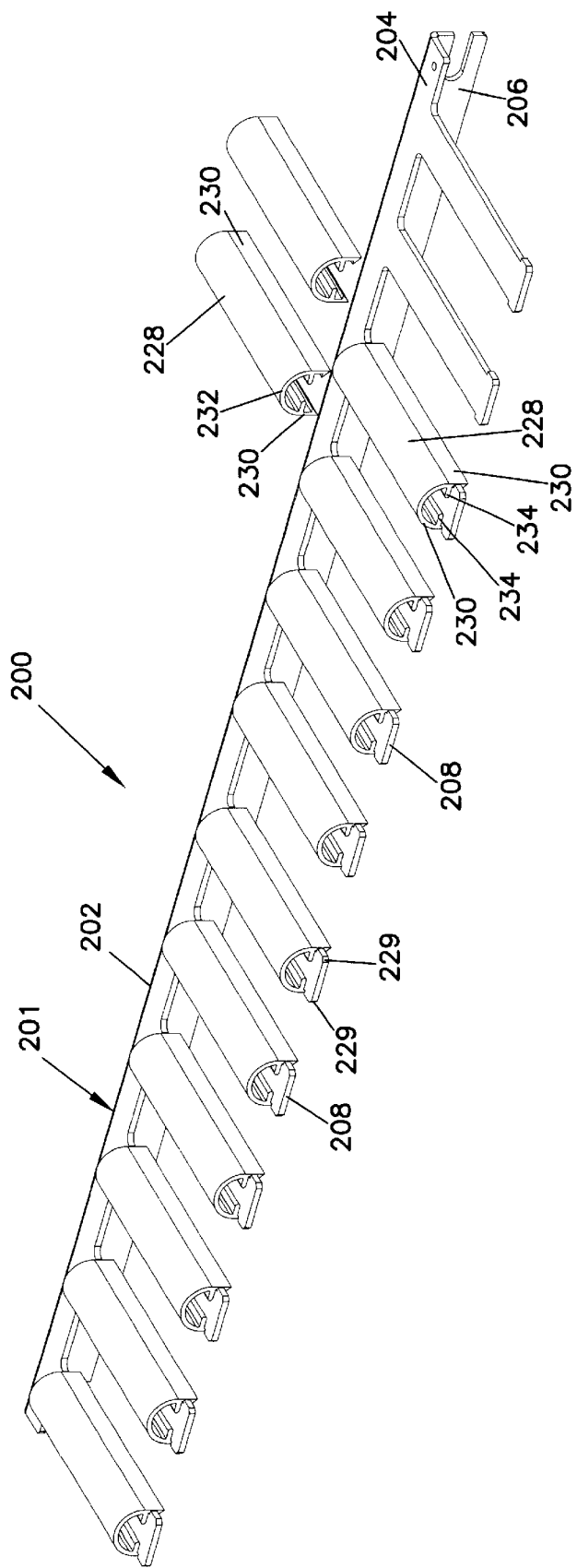
FIG. 5a is a top, perspective view of a cable management bracket constructed in accordance with the principles of the present invention, radius limiters are shown mounted on the top side of the bracket.
Figure 5B:
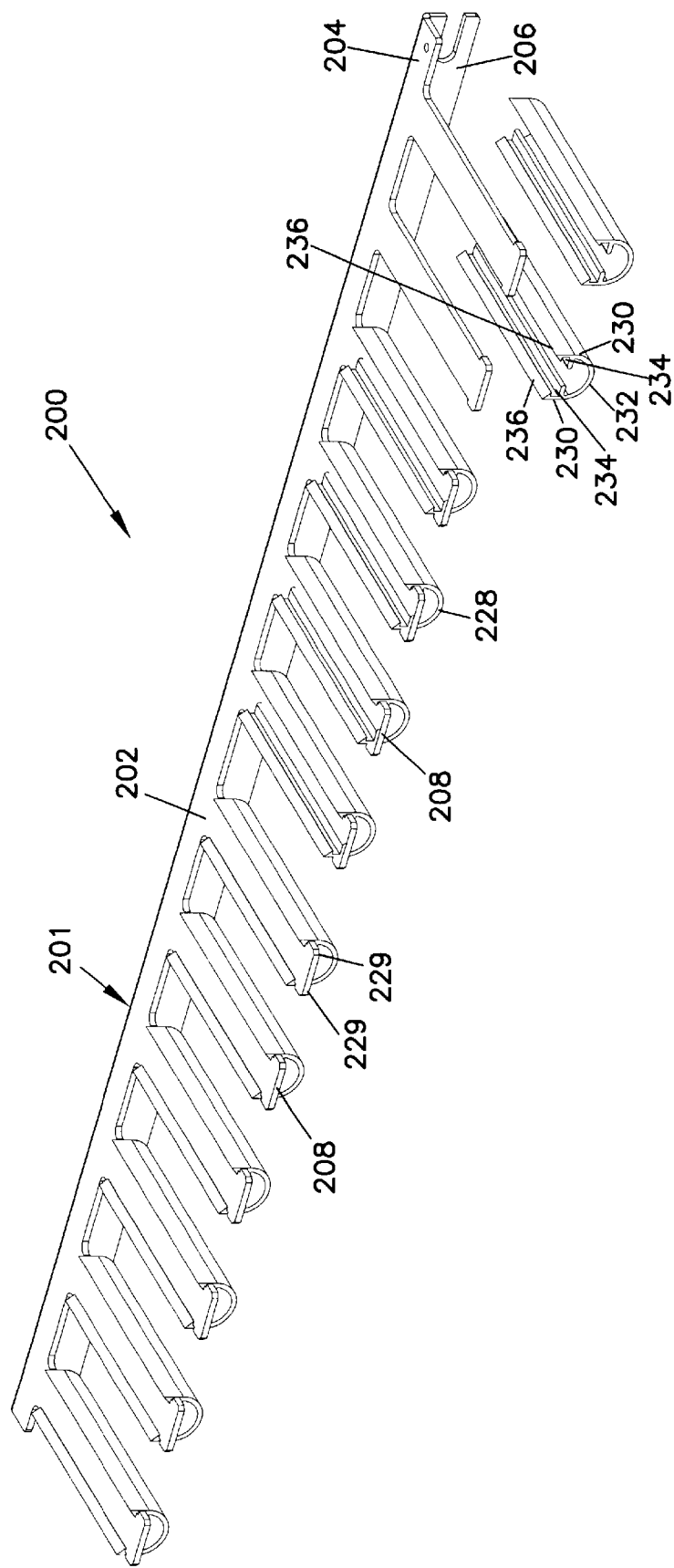
FIG. 5b shows the telecommunications bracket of FIG. 5a with the radius limiters mounted on the bottom side of the bracket.

The bend radius limiters 228 are preferably made of a resilient material and are preferably snap-fit on the fingers 208. In FIG. 5A, the radius limiters 228 are mounted on the top side of the bracket 201. This type of configuration is adapted to be mounted above a piece of telecommunications equipment for which cable management is desired (see FIGS. 7 and 8). In FIG. 5B, the radius limiters 228 are mounted on the bottom side of the bracket 201. This type of configuration is adapted to be mounted below a piece of telecommunications equipment for which cable management is desired (see FIGS. 7 and 8).

Each of the radius limiters 228 includes opposing legs 230 interconnected by a curved (e.g., semi-circular) portion 232. The curved portion 232 includes a convex outer surface that can be defined by a radius equal to or greater than the minimum recommended bend radius for the cable desired to be managed. For some embodiments, the radius can be smaller than the manufacture's recommended bend radius requirements for the cable being managed, but large enough to prevent kinking and to provide a smooth curved transition from vertical to horizontal (see FIG. 8).

Referring still to FIGS. 5A and 5B, the legs 230 of the radius limiters 228 define opposing channels 234 sided to receive the side edges of the fingers 208. Ramps 236 are positioned adjacent the channels 234. To mount one of the radius limiters 228 on its corresponding finger 208, the open end of the radius limiter is pressed against the finger 208. As the limiter 228 is pressed against the finger 208, the ramps 236 cause the legs 230 to flex apart thereby allowing the edges of the finger 208 to snap within the channels 234. To remove the radius limiter 228 from the finger 208, the legs 230 are spread apart to free the edges of the finger 208 from the channels 234. The radius limiter 228 is then pulled from the finger 208.

FIG. 7 shows the splitter assembly 50 of FIGS. 3 and 4 mounted within a conventional telecommunications rack 240. The chassis 90 of the assembly 50 is fastened to the front of the rack 240, and the LINE, POTS and DATA connectors are accessible from the rear of the rack 240. Cable management structures 200 are connected to the rear of the rack 240 at locations above and below the splitter assembly 50.

The rack 240 includes a bay in which the splitter assembly 50 is mounted. The bay is defined between left and right channel members 242L and 242R of the rack 240. Each channel member 242L and 242R has a generally C-shaped cross-section and is oriented in a vertical orientation. Legs 243 of the channels 242L and 242R define fastener openings 245 (only a few representative openings are shown). The cable management structures 200 are preferably connected to the rear of the rack 240 by fasteners 248 (e.g., bolts or screws, shown schematically in FIG. 8). The fasteners 248 extend through the slots 222 and 224 of the cable management structures 200 and through the openings 245 of the rack 240. The cable management structures 200 are preferably oriented such that the slots 224 open downwardly. Thus, the weight of the cable management structures 200 forces the closed ends of the slots 224 against the fasteners 248.

The cable management structures 200 are preferably sized to extend across the width of the rack 240. For example, the elongated bar 202 preferably has a length in the range of 18–25 inches. Two conventional rack widths are 18.3 inches and 22.3 inches. The rack widths are measured laterally between the fastener openings 245 of the rack 240 (see "W1" labeled on FIG. 7). Thus, one embodiment of the present invention has connection locations separated by 18.3 inches or separated by a distance in the range of 18–20 inches. Another embodiment of the present invention has connection locations separated by 22.3 inches or separated by a distance in the range of 22–24 inches. The term "connection locations" includes openings for receiving fasteners as well as fasteners that may be provided as part of the cable management structures. In the embodiment of FIGS. 5A and 5B, only two connection locations (i.e., slots 222 and 224) are provided on the cable management structure 200. Thus, no intermediate connection locations are provided between the slots 222 and 224.

Figure 8:
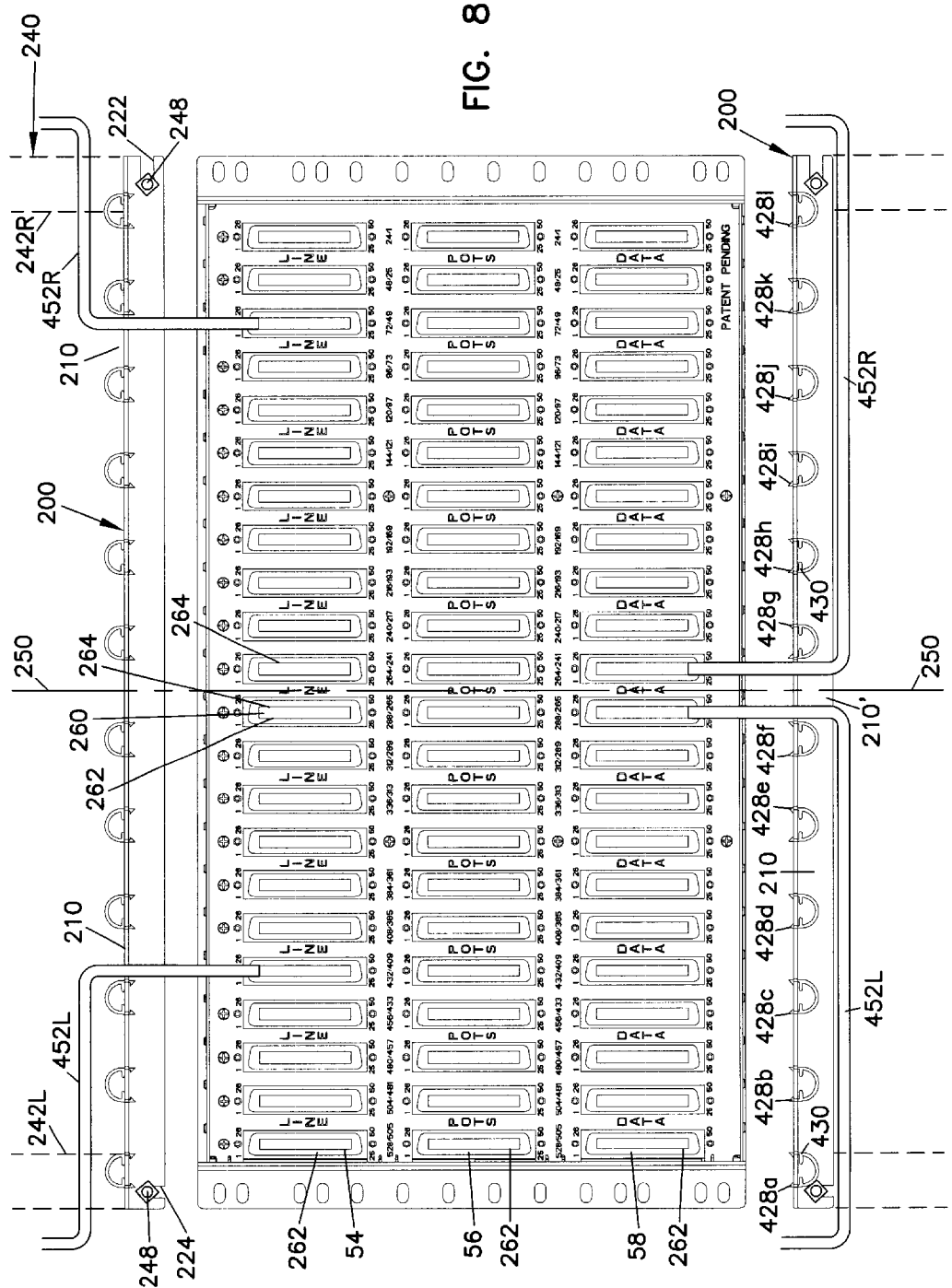
FIG. 8 is a rear elevational view of the piece of telecommunications equipment and cable management brackets of FIG. 7.

FIG. 8 schematically illustrates some exemplary routing paths for routing cables 452L, 452R through the cable management structures 200. Preferably, cables 452L, 452R connected to the LINE and POTS connectors 54 and 56 (i.e., the upper two horizontal rows) are routed through the upper cable management structure 200 and cables 452L, 452R, connected to the DATA connectors 58 are routed through the lower cable management structure 200. If a single cable management structure 200 is used, all of the cables can be routed through the single structure 200.

Still referring to FIG. 8, a vertical reference line 250 is depicted which divides the array of connectors 54, 56 and 58 into left and right groups. Cables 452L connected to connectors located to the left of the line 250 are routed to the left vertical channel member 242L. Cables 252R connected to connectors located to the right of the line 250 are routed to the right vertical channel member 242R.

When cabling the splitter assembly 50, cables 452L, 452R connected to the DATA connectors 58 are preferably routed vertically or generally vertically downwardly to the lower cable management structure 200. At the cable management structure 200, the cables 452L, 452R are passed through corresponding gaps 210 in the cable management structure 200 and bent around corresponding radius limiters 228. The cables are then pulled laterally toward a corresponding one of the vertical channel members 242L or 242R. The term laterally will be understood to mean in a direction generally along the width of the rack 240 so as to be horizontal or almost horizontal (i.e., within 30 degrees of horizontal). The radius limiters 228 allow the cables 252 to be tautly laterally pulled without kinking. With the cables held taut, the cables can be bundled (e.g., with waxed twine/lacing) or can be tied down to structures such as lances/tie-down loops. The lances/tie-down loops can be provided on the rack 240, on the bar 202 of the cable management structure 200 or elsewhere. The ability to pull the cables 452L, 452R taut without risk of kinking prevents slack in the cables thereby increasing cable density and reducing the likelihood of spaghetti. After being tied-down, the cables 252 are routed vertically (e.g., either upwardly or downwardly) along the outer channels defined by the vertical channel members 242L, 242R.

When cabling the splitter assembly 50, cables 452L, 452R connected to the LINE and POTS connectors 54 and 56 are preferably routed vertically or generally vertically upwardly to the upper cable management structure 200. At the upper cable management structure 200, the cables 452L, 452R are passed through corresponding gaps 210 in the cable management structure 200 and bent around corresponding radius limiters 228. The cables are then pulled laterally toward a corresponding one of the vertical channel members 242L, 242R and are preferable secured in place (e.g., by a tie-down technique). After being secured, the cables are routed vertically (e.g., either upwardly or downwardly) along the outer channels defined by the vertical channel members 242L and 242R.

Referring still to FIG. 8, the connectors 54, 56 and 58 each include ports 260 defining left edges 262 and right edges 264. The fingers 208 of the cable management structures 200 are preferably aligned generally with the edges 262 and 264 of selected ones of the connectors 54, 56 and 58. For example, as described in detail in the following paragraphs, the fingers 208 located to the left of the line 250 align with the left edges 262 of their corresponding connectors. Also, fingers 208 located to the right of the line 250 align with the right edges 264 of their corresponding connectors. This configuration ensures that the cables 252 are routed generally vertically from the connectors to the cable management structures 200. By routing the cables generally vertically, smooth, kink-free bends will be provided at the radius limiters. Also, the vertical routing and channelized management provided by the cable management structures 200 inhibits tangling. As is clear from the configuration of FIG. 8, the gaps 210 defined by the cable management structures 200 are each adapted to receive cables corresponding to two adjacent vertical columns of connectors 54, 56 and 58.

Counting from left to right, the outer surfaces of the right legs 230 of 1st radius limiters 428a are shown in vertical alignment with the left edges 262 of the 1st column of connectors 54, 56 and 58. The outer surfaces of the right legs 230 of 2nd radius limiters 428b are shown in vertical alignment with the left edges 262 of the 3rd column of connectors 54, 56 and 58. The outer surfaces of the right legs 230 of 3rd radius limiters 428c are shown in vertical alignment with the left edges 262 of the 5th column of connectors 54, 56 and 58. The outer surfaces of the right legs 230 of 4th radius limiters 428d are shown in vertical alignment with the left edges 262 of the 7th column of connectors 54, 56 and 58. The outer surfaces of the right legs 230 of 5th radius limiters 428e are shown in vertical alignment with the left edges 262 of the 9th column of connectors 54, 56 and 58. The outer surfaces of the right legs 230 of 6th radius limiters 428f are shown in vertical alignment with the left edges 262 of the 11th column of connectors 54, 56 and 58.

Still counting from left to right, the outer surfaces of the left legs 230 of 7th radius limiters 428g are shown in vertical alignment with the right edges 264 of the 12th column of connectors 54, 56 and 58. The outer surfaces of the left legs 230 of 8th radius limiters 428h are shown in vertical alignment with the right edges 264 of the 14th column of connectors 54, 56 and 58. The outer surfaces of the left legs 230 of 9th radius limiters 428i are shown in vertical alignment with the right edges 264 of the 16th column of connectors 54, 56 and 58. The outer surfaces of the left legs 230 of 10th radius limiters 428j are shown in vertical alignment with the right edges 264 of the 18th column of connectors 54, 56 and 58. The outer surfaces of the left legs 230 of 11th radius limiters 428k are shown in vertical alignment with the right edges 264 of the 20th column of connectors 54, 56 and 58. The outer surfaces of the left legs 230 of 12th radius limiters 428l are shown in vertical alignment with the right edges 264 of the 22nd column of connectors 54, 56 and 58.

As described above, a left-to-right transition occurs between the $6^{th}$ radius limiters 428f and the $7^{th}$ radius limiters 428g. Specifically, the radius limiters change from aligning their right legs 230 with the left edges 262 of the connectors 54, 56 and 58, to aligning their left legs 230 with the right edges 264 of the connectors 54, 56 and 58. To provide this transition, the center gap 210' of each cable management structures 200 is larger than the other gaps 210.

Still referring to FIG. 8, the array of connectors 54, 56 and 58 is not centered within the bay of the rack 240. Instead, the array is offset to the left. To match this offset, the array of fingers 208 of the cable management structure 200 is also arranged in an offset (i.e., non-centered) configuration. In other words, the array of fingers 208 is not perfectly centered between the connection locations of the cable management structures 200. Instead, the array of fingers 208 is offset so as to be slightly closer to the left end of the elongated bar 202 than the right end of the elongated bar 202.

A concern in cabling a rack is to stay within the footprint of the rack. The footprint of a rack is typically defined by the size of the base (see base 211 of rack 240 in FIG. 7). A common base has a depth of 15 inches (the depth is labeled "d" in FIG. 7). To assist a technician in staying within the footprint, the depth of the cable management structure 200, as defined by the lengths of the fingers 208, is selected such that the structure 200 does not extend beyond the footprint of the rack.

Figure 9:
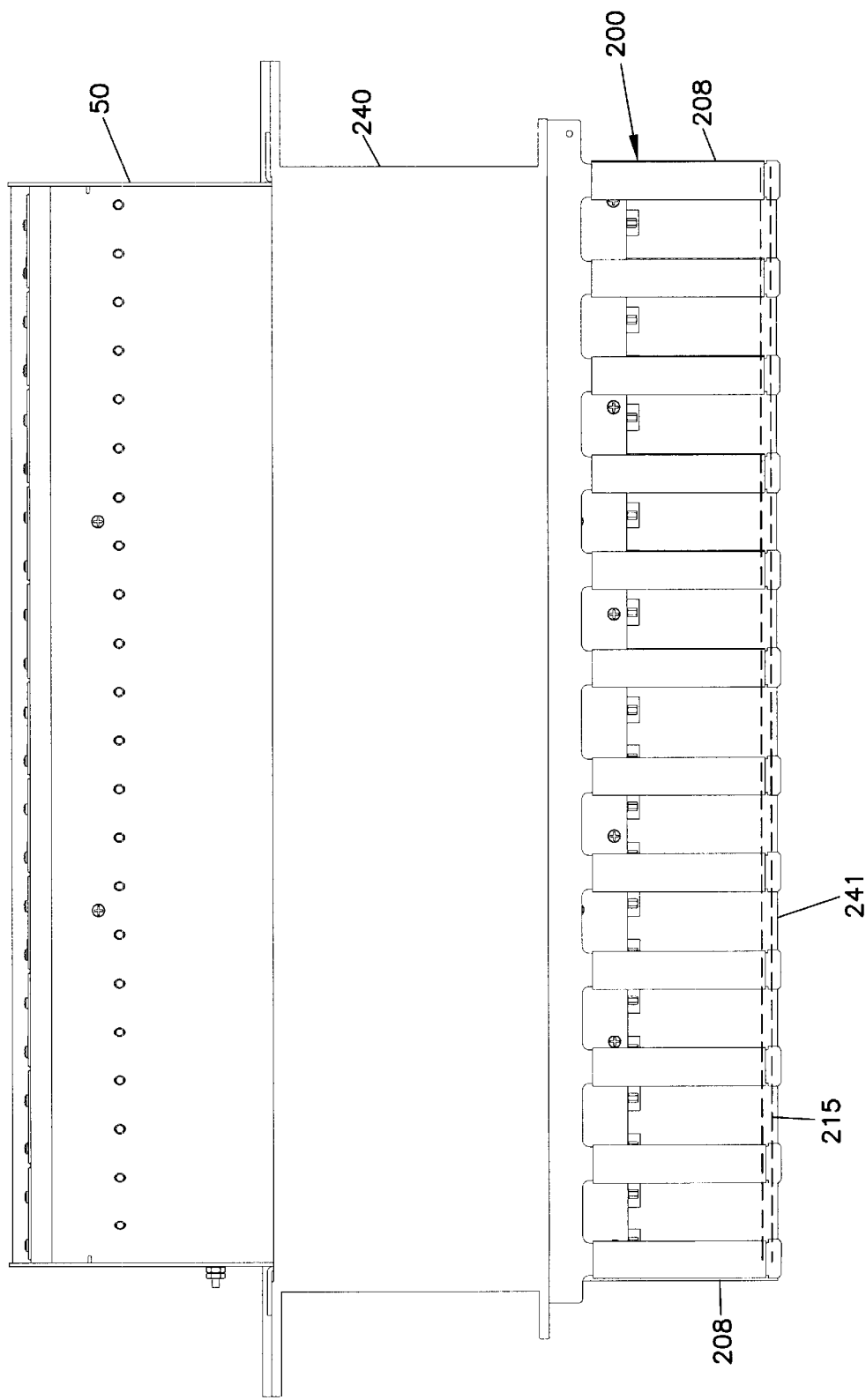
FIG. 9 is a top plan view of the piece of telecommunications equipment and cable management brackets of FIG. 7.

As shown in FIG. 9, the fingers 208 of the cable management structure 200 terminate at the same location as the back edge 241 of the footprint of the rack 240. Thus, when cabling the splitter assembly, a technician will know that the cables are within the footprint depth as long as the cables are within the gaps 210 defined between the fingers 208 of the cable management structures 200. In an alternative embodiment, a removable retainer 215 (shown in dashed line) can be mounted at the tips of the fingers 208 to block the gaps 210 and prevent cables from moving outside the gaps 210.

Figure 10:
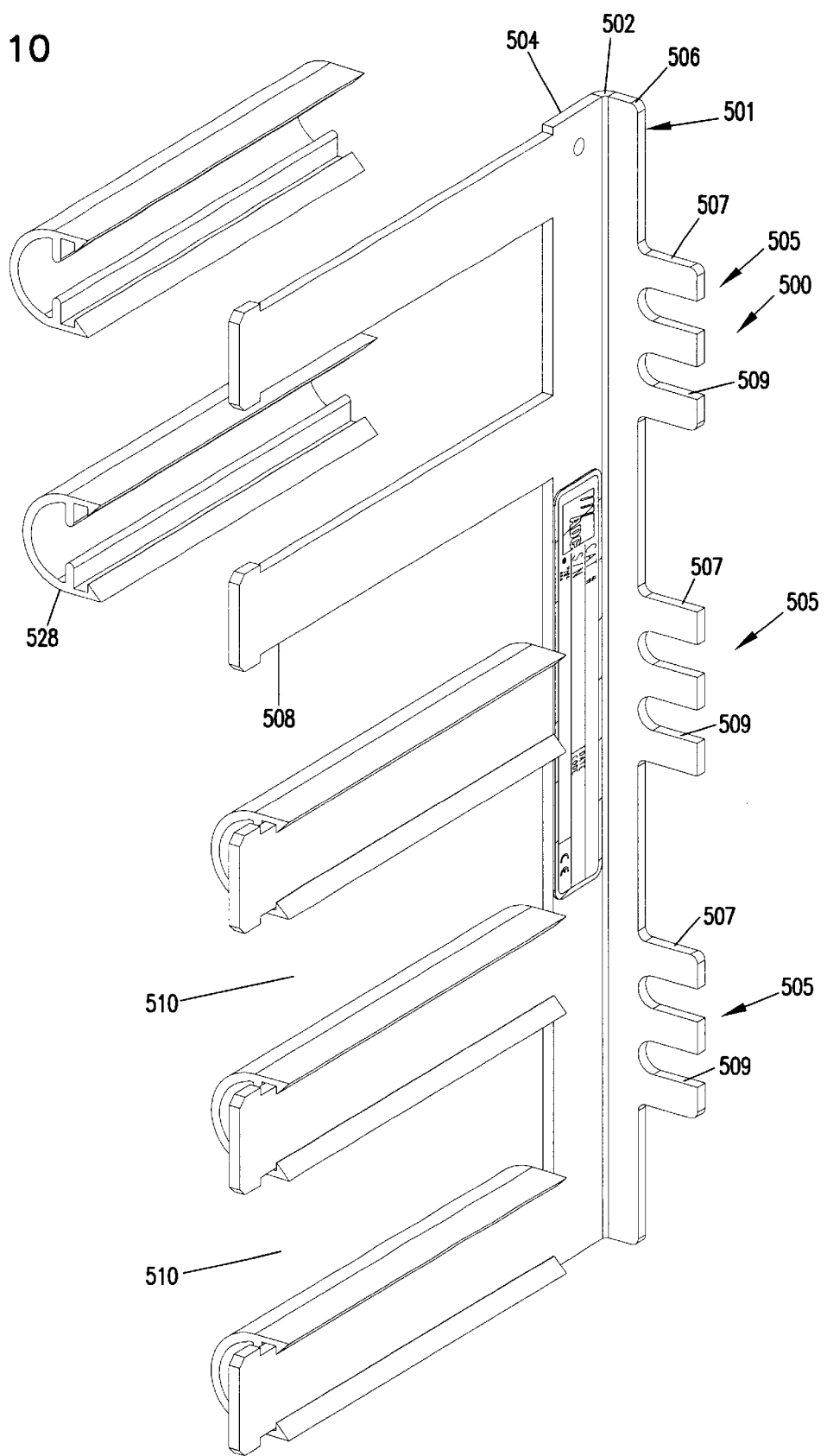
FIG. 10 is a perspective view of another cable management bracket constructed in accordance with the principles of the present invention.
Figure 11:
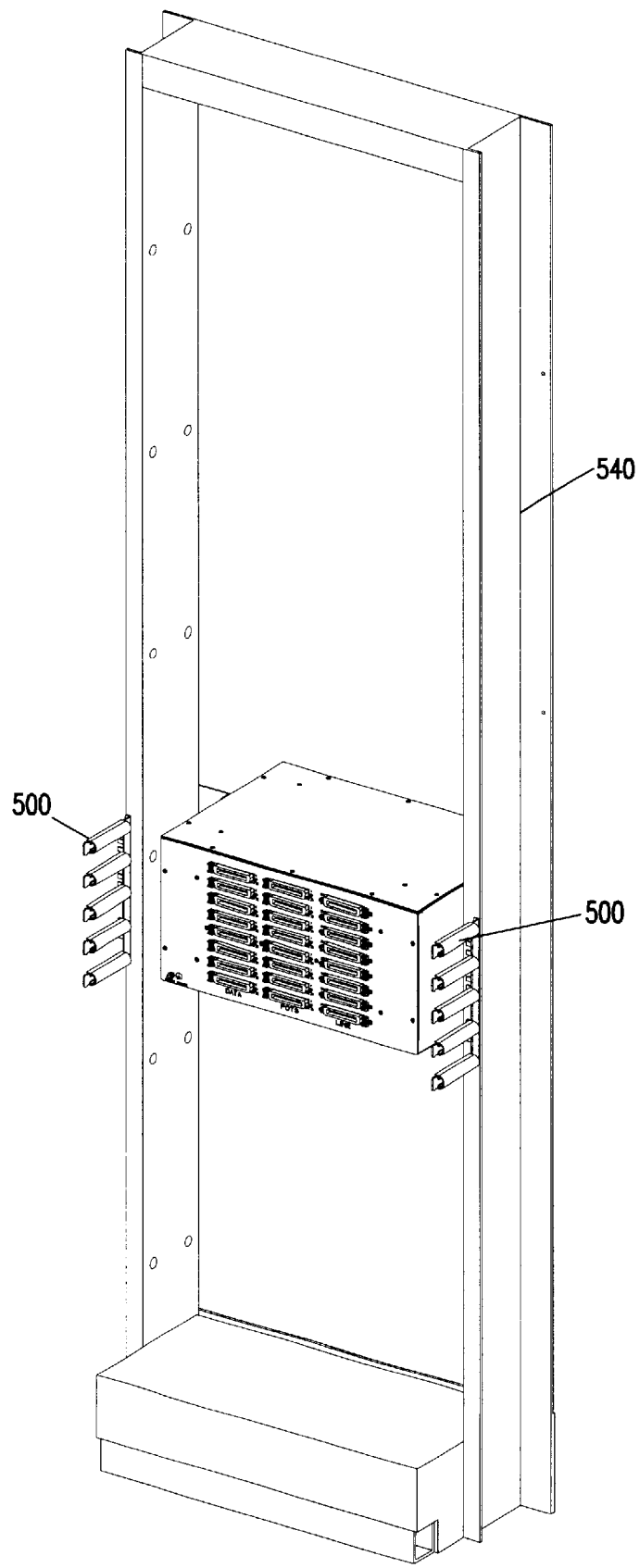
FIG. 11 shows two of the cable management brackets of FIG. 10 mounted vertically on a telecommunications rack on opposite sides of a piece of telecommunications equipment (e.g., a splitter chassis)

FIG. 10 shows a cable management structure 500 adapted to be mounted vertically on a rack 540 (see FIG. 11). The cable management structure 500 includes a bracket 501 preferably constructed of a material such as bent sheet-metal. The bracket 501 includes an elongated member or bar 502. The bar includes first and second legs 504 and 506 preferably aligned generally at right angles relative to one another. A plurality of cable management fingers 508 project outwardly from the first leg 504 of the bar 502. The fingers 508 and the first leg 504 are generally coplanar. Radius limiters 528 are mounted on the fingers 508.

Referring still to FIG. 10, the fingers 508 are generally parallel to one another and are spaced-apart along the length of the bar 502. Gaps 510 (e.g., four gaps) for receiving cables are defined between the fingers 508. The gaps 510 are preferably sized for receiving a plurality of telecommunications cables. In one embodiment, the gaps are about 1.4 inches in width and 3.5 inches in length.

The second leg 506 of the bar 502 preferably includes structure for allowing the bracket 501 to be connected to a telecommunications rack. For example, three discrete connection locations 505 are provided at the second leg 506. The connection locations 505 are formed by extensions 507 that are co-planar with the second leg 506 and that project outwardly from the second leg 506. The connection locations 505 each include two open-ended slots 509 defined within the extensions 507. The slots 509 are sized for receiving fasteners used to fasten the bracket 501 to the rack 540.

For some applications, the open-ended shape of the slots 509 allows the bracket 501 to be mounted to a rack with the same fasteners used to mount a corresponding piece of telecommunications equipment to the rack. For example, for a front access splitter chassis mounted to a rack/cabinet, the chassis is secured to the rack with fasteners positioned at the front of the rack. Since the chassis is front access (i.e., the LINE, POTS and DATA connectors face forwardly), cable management would be preferred at the front of the rack. To mount the bracket 501 at the front of the rack, the fasteners used to secure the chassis to the front of the rack are loosened. Once the fasteners are loose, the bracket 501 can be laterally slid into place with the fasteners received within the open-ended slots 509. The fasteners are then re-tightened to hold the bracket 501 in place. In this manner, the bracket 501 can be mounted without requiring the fasteners to be completely removed from the rack.

Figure 12A:
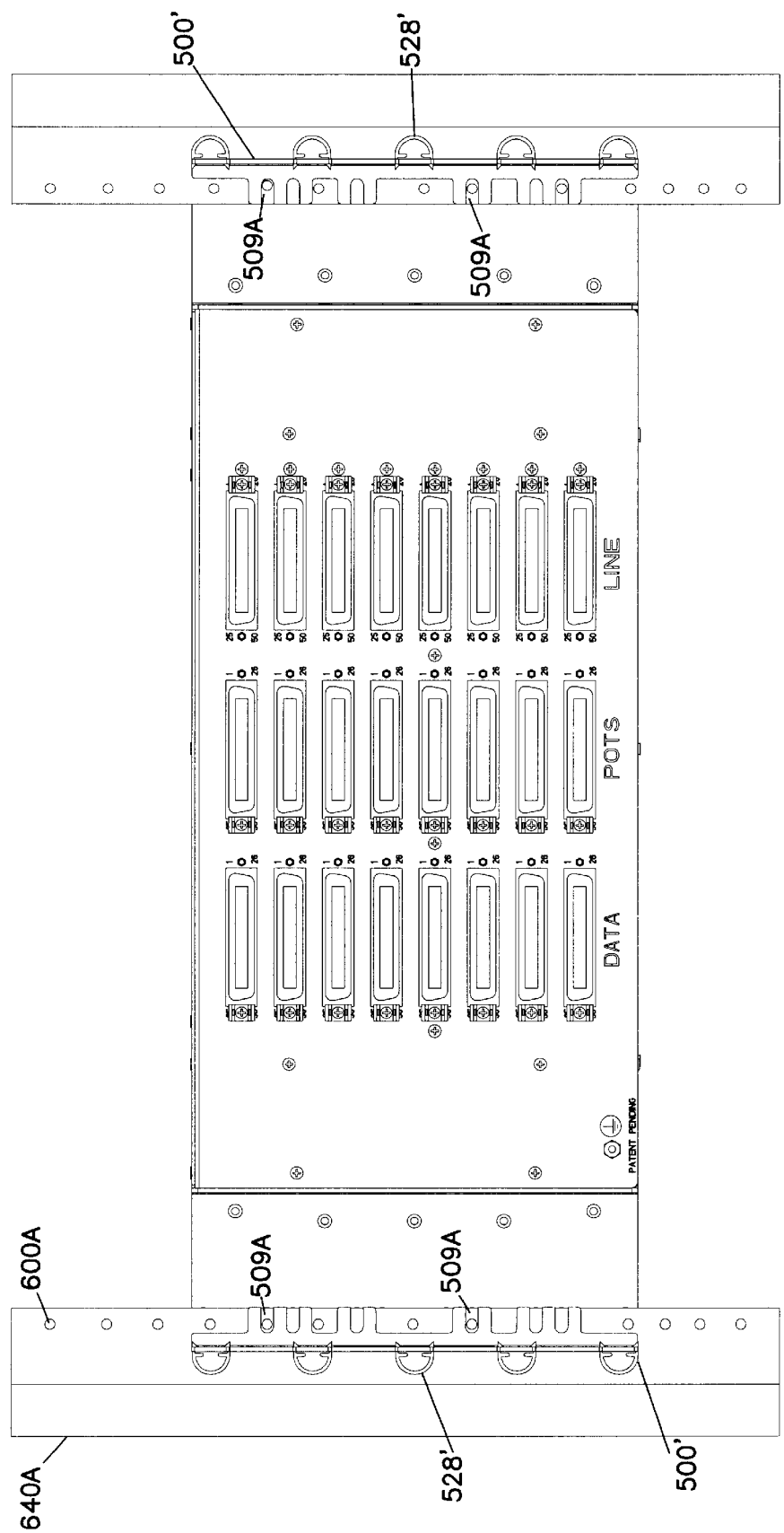
FIG. 12A shows a pair of additional cable management brackets mounted on a first type of rack.
Figure 12B:
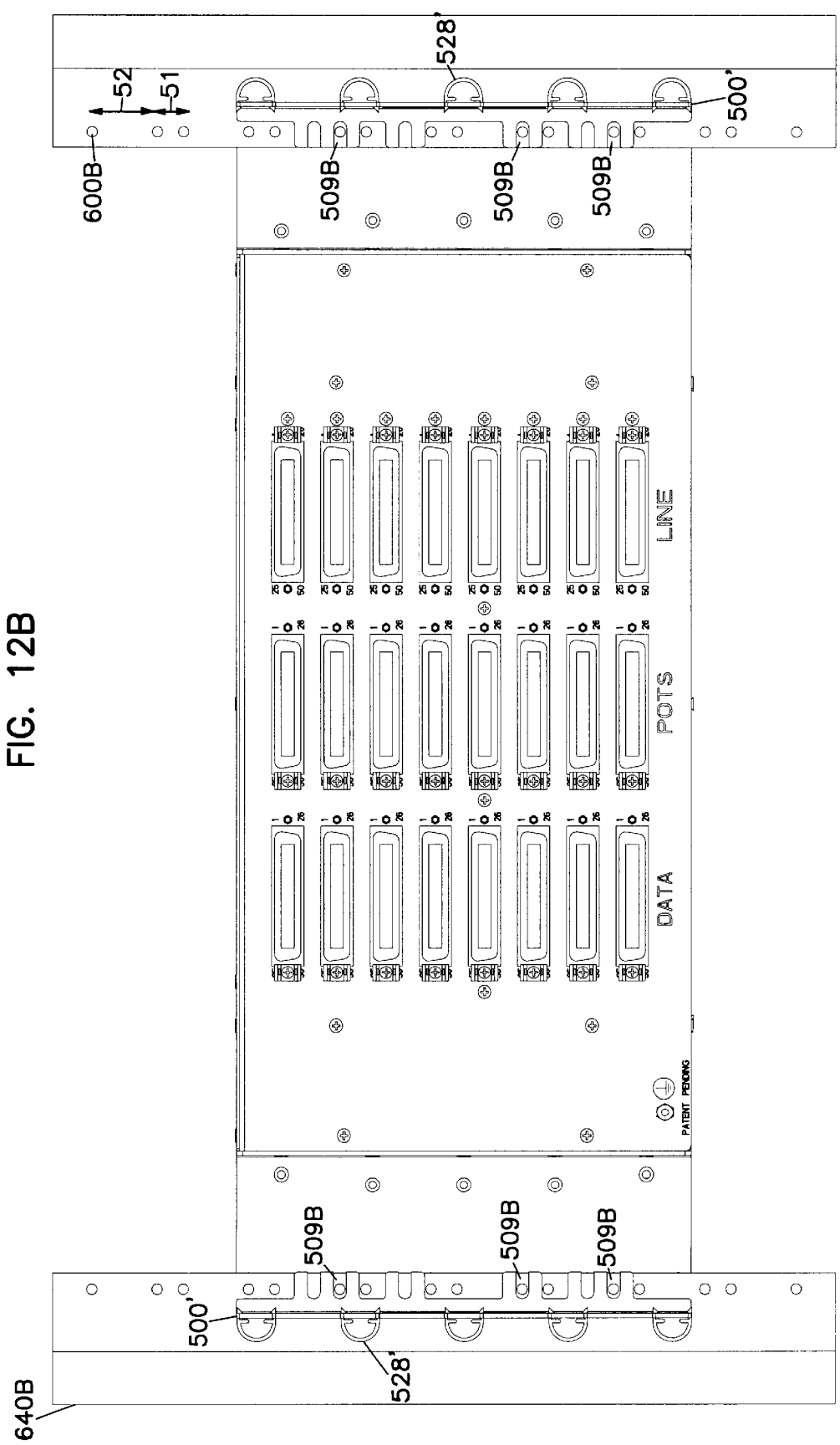
FIG. 12B shows the cable management brackets of FIG. 12A mounted on a second type of rack.

Telecommunications racks are known to have fastener openings arranged in different patterns. For example, a common fastener opening pattern has fastener openings 600A each vertically separated by an inch as measured from center-to-center of the openings 600A (see rack 640A of FIG. 12A). Another common fastener opening pattern has fastener openings 600B alternatingly separated by a 0.5 inch spacing S1 and a 1.25 inch spacing S2 (see rack 640B of FIG. 12B). FIGS. 12A and 12B show left and right cable management structures 500' mounted on the rear sides of racks 640A and 640B on opposite sides of a splitter assembly. The cable management structures 500' are adapted for managing cables routed laterally from the LINE, POTS and DATA connectors to the side channels of the racks 640A and 640B. Bend radius limiters 528' prevent the cables from being excessively bent when transitioning from a lateral orientation to a vertical orientation within the side channels of the racks 640A and 640B.

The cable management structures 500' have the same configuration as the structure 500 of FIG. 11, except connection locations have been modified. The connection locations provide fastener receiving slots positioned such that the cable management structure 500' is compatible with both racks 640A and 640B. For example, as shown in FIG. 12A, the cable management structure 500' has slots 509A that align with the fastener openings 600A of the rack 640A. As shown in FIG. 12B, the cable management structure 500' also has slots 509B that align with the fastener openings 600B of the rack 640B.

With regard to the foregoing description, it is to be understood that changes may be made in detail without departing from the scope of the present invention. It is intended that the specification and depicted aspects of the invention may be considered exemplary, only, with a true scope and spirit of the invention being indicated by the broad meaning of the following claims.

We claim:

1. A telecommunications system comprising:
   a telecommunications rack having a width and a height;
   a piece of telecommunications equipment connected to the rack;
   a cable management structure for managing cables connected to the piece of telecommunications equipment, the cable management structure including:
   a plurality of finger that project outwardly from the rack, the fingers being spaced apart along the width of the rack, the fingers defining gaps between the fingers, the gaps being sized to receive telecommunications cables;
   bend radius limiters connected to the fingers; and
   wherein the piece of telecommunications equipment includes an array of connectors defining ports for receiving plugs, he ports being defined by left and right edges, the array of connectors being dividable into a left half and a right half, the radius limiters corresponding to the left half of the array being positioned to have surfaces aligned in common vertical planes with the left edges of at least some of the connectors in the left half, the radius limiters corresponding to the right half of the array being positioned to have surfaces aligned in common vertical planes with the right edges of at least some of the connectors in the left half.

2. The telecommunications system of claim 1, wherein the fingers project outwardly from a rear side of the rack.

3. The telecommunications system of claim 1, wherein the fingers are aligned generally along a common horizontal plane.

4. The telecommunications system of claim 1, wherein the fingers include ends, and wherein the system further comprises a cable retainer removably connected to ends of the fingers for preventing cables passing through the gaps from moving beyond the ends of the fingers.

5. The telecommunications system of claim 1, wherein the piece of telecommunications equipment is a splitter assembly.

6. The telecommunications system of claim 1, wherein the cable management structure is positioned below the piece of telecommunications equipment.

7. The telecommunications system of claim 1, wherein the cable management structure is positioned above the piece of telecommunications equipment.

8. The telecommunications system of claim 1, wherein the rack includes left and right vertical side channels, and wherein the plurality of fingers is not centered between the side channels.

9. The telecommunications system of claim 1, wherein the gaps include a middle gap, the middle gap having a width that is larger than widths of a remainder of the gaps.

10. The telecommunications system of claim 1, wherein the gaps include a middle gap, the middle gap having a width that is larger than widths of a remainder of the gaps.

11. The telecommunications system of claim 1, further comprising cables connected to the piece of telecommunications equipment, the cables extending generally vertically from the piece of telecommunications equipment to the cable management structure, the cables extending through the gaps of the cable management structure and being bent around the bend radius limiters to transition from a generally vertical orientation to a generally horizontal orientation.

12. The telecommunications system of claim 1, wherein the rack has a base defining a footprint, and wherein the cable management structure does not extend beyond the footprint.

* * * * *

UNITED STATES PATENT AND TRADEMARK OFFICE
CERTIFICATE OF CORRECTION

PATENT NO. : 6,614,665 B2
DATED : September 2, 2003
INVENTOR(S) : Witty et al.

It is certified that error appears in the above-identified patent and that said Letters Patent is hereby corrected as shown below:

<u>Column 11,</u>
Line 19, "plurality of finger" should read -- a plurality of fingers --
Line 27, "plugs, he ports" should read -- plugs, the ports --

Signed and Sealed this

Tenth Day of February, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,614,665 B2
DATED : September 2, 2003
INVENTOR(S) : Witty et al.

It is certified that error appears in the above-identified patent and that said Letters Patent is hereby corrected as shown below:

<u>Title page,</u>
Item [56], References Cited, after FOREIGN PATENTS, insert the following:

-- OTHER PUBLICATIONS
"BroadWire™ 528-Port 23-Inch Central Office ADSL Splitter Chassis Installation Guide", *ADC Telecommunications, Inc.*, ADCP-92-011, Issue 1, pp 1-17 (August 2000).

"En*tera*prise™ Structured Connectivity Systems Glide Cable Management System", *ADC* Telecommunications, *Inc.*, 12 pgs. (November 2000). --

Signed and Sealed this

Eighth Day of June, 2004

JON W. DUDAS
*Acting Director of the United States Patent and Trademark Office*